(12) United States Patent
Kim

(10) Patent No.: US 7,972,896 B2
(45) Date of Patent: Jul. 5, 2011

(54) MULTI-BIT MEMORY CELL STRUCTURE AND METHOD OF MANUFACTURING THE SAME

(75) Inventor: Kwang-Jeon Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 288 days.

(21) Appl. No.: 12/330,640

(22) Filed: Dec. 9, 2008

(65) Prior Publication Data

US 2009/0146129 A1 Jun. 11, 2009

(30) Foreign Application Priority Data

Dec. 11, 2007 (KR) .................. 10-2007-0128536

(51) Int. Cl.
*H01L 21/06* (2006.01)
(52) U.S. Cl. .............................. 438/103; 438/102; 257/4
(58) Field of Classification Search ...... 257/4; 438/102, 438/103
See application file for complete search history.

(56) References Cited

U.S. PATENT DOCUMENTS

| 7,642,622 | B2 | 1/2010 | Yi et al. | |
|---|---|---|---|---|
| 2005/0130414 | A1 | 6/2005 | Choi et al. | |
| 2006/0118913 | A1* | 6/2006 | Yi et al. | 257/613 |
| 2007/0155093 | A1* | 7/2007 | Jeong et al. | 438/257 |

FOREIGN PATENT DOCUMENTS

| CN | 1808736 | 7/2006 |
|---|---|---|
| KR | 10-2005-0059400 | 6/2005 |

* cited by examiner

*Primary Examiner* — Bradley K Smith
(74) *Attorney, Agent, or Firm* — Sherr & Vaughn, PLLC

(57) ABSTRACT

A method of manufacturing a semiconductor memory cell including phase change material. A multi-bit memory cell may implement phase change material. Various kinds of information can be stored in one memory cell. A chip size may be minimized without sacrificing capacity and/or memory performance, as compared with a one-bit memory cell.

16 Claims, 1 Drawing Sheet

MULTI-BIT MEMORY CELL STRUCTURE AND METHOD OF MANUFACTURING THE SAME

Figure 1:
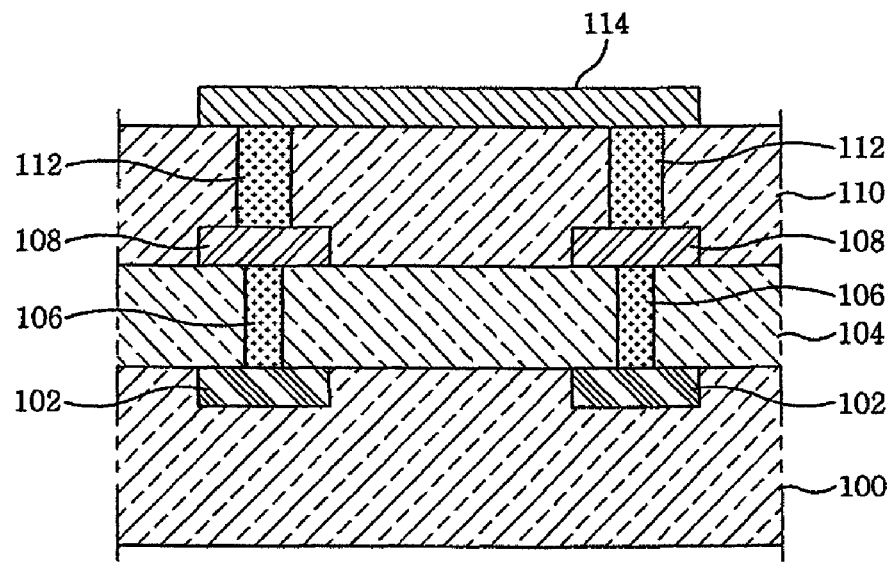

The present application claims priority under 35 U.S.C. 119 to Korean Patent Application No. 10-0128536 (filed on Dec. 11, 2007), which is hereby incorporated by reference in its entirety.

BACKGROUND

As semiconductor technology has developed, there have been developments in producing large-capacity and highly integrated semiconductor devices, including an overall reduction in size of semiconductor devices. Accordingly, relatively highly integrated semiconductor devices may require fine semiconductor production technology. Some semiconductor memory products may be based on two bits, with 0/1 signal switching. However, fine semiconductor production technology may necessitate memory cells based on multi bits in memory products. Technology that generates multi-bit data may use phase change material. Phase change material is a material that can exhibit two physical states, which may be set to one of the states to express multi-bit data. Accordingly, if a memory product that expresses multi-bit data by using the phase change material, data storage capacity may be increased while the chip size may be minimized.

SUMMARY

Embodiments relate to a method of manufacturing a semiconductor device. In embodiments, a multi-but memory cell structure may use a phase change material. In embodiments, a method of manufacturing a multi-bit memory cell structure may enable various kinds of information to be stored in one memory cell, which may be effective in minimizing the size of a chip and/or maximizing memory performance.

In embodiments, a method of manufacturing a multi-bit memory cell may include at least one of the following steps: Forming a plurality of lower conductive material plates, arranged at regular intervals in a memory cell region on and/or over a semiconductor substrate. Forming a first insulating film one and/or over the lower conductive material plates. Forming a plurality of first contacts correspondingly connected to the lower conductive material plates. Forming a plurality of gate plates at regular intervals which are correspondingly connected to the lower conductive material plates through the first contacts. Forming a second insulating film to cover the plurality of gate plates. Forming a plurality of second contacts correspondingly connected to the gate plates. Forming an upper conductive material plate connected to the a plurality of gate plates through the second contacts.

In embodiments, a multi-bit memory cell structure may include at least one of: A plurality of lower conductive material plates arranged at regular intervals in a memory cell region on and/or over a semiconductor substrate. A plurality of first contacts that are correspondingly connected to the lower conductive material plates. A plurality of gate plates that are arranged at regular intervals and correspondingly connected to the lower conductive material plates through the first contacts. A plurality of second contacts that are correspondingly connected to the gate plates. An upper conductive material plate that is connected to the plurality of gate plates through the second contacts.

In embodiments, a multi-bit memory cell using a phase change material is manufactured, which may result in various kinds of information stored in a single memory cell. Accordingly, the relative size of a chip may be minimized, without sacrificing capacity and/or memory performance.

DRAWINGS

Example FIG. 1 is a schematic view illustrating a manufacturing process of a multi-bit memory cell, in accordance with embodiments.

Figure 2:
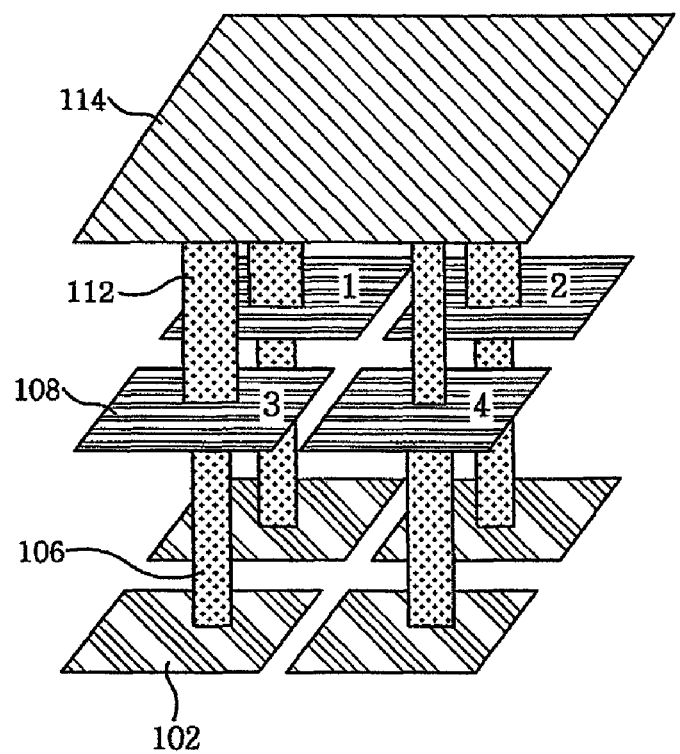

Example FIG. 2 is a perspective view of a 5-bit memory cell, in accordance with embodiments.

DESCRIPTION

In embodiments, phase change material is used during manufacturing a semiconductor memory cell. Accordingly, in embodiments, various kinds of information may be stored in one memory cell. In embodiments, the size of a chip may be minimized without sacrificing capacity and/or memory performance, compared with a one-bit memory cell.

Example FIG. 1 is a schematic view of a manufacturing process of a multi-bit memory cell, according to embodiments. A plurality of lower conductive material plates 102, which may serve as drains, may be formed at regular intervals in a memory cell region on and/or over semiconductor substrate 100. First insulating film 104 may be formed on and/or over lower conductive material plates 102. A plurality of first contacts 106 may be formed to connect and/or couple to lower conductive material plates 102. A plurality of gate plates 108 may be formed on and/or over first contacts 106. The plurality of gate plates 108 may correspond to lower conductive material plates 102. Gate plates 108 may be connected and/or coupled to lower conductive material plates 102 through the first contacts 106. In embodiments, gate plates 108 may include phase change material. Second insulating film 110 may be formed on and/or over the plurality of gate plates 108. A plurality of second contacts 112 may be formed in second insulating film 110. The plurality of second contacts 112 may be connected and/or coupled to gate plates 108. Upper conductive material plate 114 may be formed over second insulating film 110. Upper conductive material plate 114 may be connected and/or coupled to the plurality of gate plates 108 through second contacts 112.

As illustrated in example FIG. 1, a multi-bit memory cell may include gate plates 108 (including phase change material) formed in a parallel matrix, in accordance with embodiments. Second contacts 112 may supply current to gate plates 108 from upper conductive material plate 114. In embodiments, different gate plates 108 (including phase change material) may have a different contact areas with different second contacts. In embodiments, electrons travel from a relatively wide region (e.g. second contacts 112) to a relatively narrow region (e.g. first contacts 106) may collide against each other and the collisions may generate thermal energy (i.e. heat). Generated thermal energy may cause phase change material of gate plates 108 to change phase. In embodiments, when the same current flows through in parallel through the different sized contacts (e.g. first contacts and/or second contacts), the degree and/or rate at which the phase change material of the gate plates 108 changes phase may differ depending the relative ratios contact area at the respective gate plates 108. Accordingly, by configuring different contact areas between the second contact 112 and the gate plate 108, the current may differ, resulting in differences in the change of phase of the phase change material of the gate plates. As a result, the amount of a current flowing to the lower conductive material plate 102 (e.g. serving as a drain) may be distinguishable and/or adjustable.

Example FIG. 2 is a perspective view of a multi-bit memory cell, in which gate plates formed of a phase change material are arranged at regular intervals, in accordance with embodiments. Example FIG. 2 illustrates a multi-bit memory cell configured to express 5-bits of information. Second contacts 112, which contact and/or couple to upper conductive material plate 114 may be configured to serve as a source. Gate plates 108 (e.g. including phase change material) may be configured to serve as a gate. Gate plates 108 may have different contact with second contacts 112. The sets of second contact 112, gate plates 108, and first contacts 106 may be arranged in parallel, in accordance with embodiments. In embodiments, second contacts 112 may be formed to have a diameter less than or equal to 90 nm (although other dimensions may be appreciated). First contacts 106, which correspondingly connect and/or couple gate plates 108 to lower conductive material plates 102, may be configured to serve as a drain. In embodiments, first contacts may have substantial the same area, volume, and/or interface dimensions. Second contacts 112 may include a conductive material (e.g. copper (Cu)), in accordance with embodiments. However, other materials may be appreciated. Second contacts may be configured to have a relatively low resistance. In embodiments, differences between the contacts has to be substantially constant. In embodiments, heat from the gate plate 108 may be inversely proportional to the area of the contact.

When the second contacts 112 connecting the upper conductive material plate 114 with the gate plates 108 have different contact areas, the degree of phase change may be in order of 4, 3, 2, and 1 (as illustrated in example FIG. 2). For example, the degree of phase change may correspond to the ascending size of contact areas of the different sized second contacts 112 with the gate plates 108, in accordance with embodiments. The number gates plates 108 that change phase depends on the amount of current flowing through the gate plate 108. For example, the amount of current input into the lower conductive material plates 102 (e.g. serving as a drain) discontinuously changes according to the degree of phase change in the respective gate plates 108, in accordance of embodiments. By sensing the difference in current input into the lower conductive material plates 102 between the parallel sets of first contacts 106, gate plates 108, and second contacts 112, information may be distinguished, in accordance with embodiments. Accordingly, in embodiments, a multi-bit memory cell may be implemented.

In embodiments, the number of gate plates 108 formed of a phase change material may be two or more. When the number of gate plates is 2, a 3-bit cell may be formed. When the number of gate plates is 3, a 4-bit cell can be formed. As shown in example FIG. 2, when the number of gate plates is 4, a 5-bit cell can be formed. In embodiments, any number of gate plates may be formed to form a bit cell that can process any number of bits. In embodiments, to erase the phase change material in the memory cell in which information is stored, and to return its original state, current may be flowed at a level such that none of the gate plates 108 undergo a change in phase. An extent that the gate plate 108 having the smallest contact area does not undergo the phase change. In embodiments, if the difference between the areas of contact is too large, it may take a relatively long time to erase perform an erase operation. Accordingly, in embodiments, the difference between the different areas of contact may be minimized, although large enough to allow for level detection.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a plurality of lower conductive material plates over a semiconductor substrate;
    forming a first insulating film over the plurality of lower conductive material plates;
    forming a plurality of first contacts in the first insulating film, wherein the plurality of first contacts are coupled to the plurality of lower conductive material plates in one-to-one correspondence;
    forming a plurality of gate plates arranged in a parallel matrix over the first insulating film, wherein the plurality of gate plates are coupled to the plurality of first contacts in one-to-one correspondence, and wherein the plurality of gate plates comprise phase change material;
    forming a second insulating film over the plurality of gate plates;
    forming a plurality of second contacts in the second insulating film, wherein the plurality of second contacts are coupled to the gate plates in one-to-one correspondence; and
    forming an upper conductive material plate over the second insulating film, wherein the upper conductive material plate is coupled to the plurality of second contacts,
    wherein contact areas between the plurality of the gate plates and the plurality of the second contacts are different from each other in size.

2. The method of claim 1, wherein the method is a method of manufacturing a multi-bit memory cell.

3. The method of claim 2, wherein the multi-bit memory cell comprises at least three bits.

4. The method of claim 3, wherein the multi-bit memory cell comprises at least five bits.

5. The method of claim 1, wherein the phase change material changes phase according to the amount of an electric current flowing through each of the plurality of gate plates.

6. The method of claim 1, wherein contact areas between the plurality of the gate plates and the plurality of the first contacts are the same in size.

7. The method of claim 1, wherein the plurality of gate plates change phases in an ascending size order of the contact areas with an increase of an electric current flowing through the gate plates.

8. The method of claim 1, wherein each of the plurality of second contacts have a diameter between approximately 60 nm and approximately 90 nm.

9. An apparatus comprising:
    a plurality of lower conductive material plates formed over a semiconductor substrate;
    a first insulating film formed over the plurality of lower conductive material plates;
    a plurality of first contacts formed in the first insulating film, wherein the plurality of first contacts are coupled to the plurality of lower conductive material plates in one-to-one correspondence;
    a plurality of gate plates arranged in a parallel matrix over the first insulating film, wherein the plurality of gate plates are coupled to the plurality of first contacts in one-to-one correspondence, and wherein the plurality of gate plates comprise phase change material;

a second insulating film formed over the plurality of gate plates;

a plurality of second contacts formed in the second insulating film, wherein the plurality of second contacts are coupled to the gate plates in one-to-one correspondence; and an upper conductive material plate formed over the second insulating film, wherein the upper conductive material plate is coupled to the plurality of second contacts, wherein contact areas between the plurality of the gate plates and the plurality of the second contacts are different from each other in size.

10. The apparatus of claim 9, wherein the apparatus is a multi-bit memory cell.

11. The apparatus of claim 10, wherein the multi-bit memory cell comprises at least three bits.

12. The apparatus of claim 11, wherein the multi-bit memory cell comprises at least five bits.

13. The apparatus of claim 9, wherein the phase change material changes phase according to the amount of an electric current flowing through each of the plurality of gate plates.

14. The apparatus of claim 9, wherein contact areas between the plurality of the gate plates and the plurality of the first contacts are the same in size.

15. The apparatus of claim 9, wherein the plurality of gate plates change phases in an ascending size order of the contact areas with an increase of an electric current flowing through the gate plates.

16. The apparatus of claim 9, wherein each of the plurality of second contacts have a diameter between approximately 60 nm and approximately 90 nm.

* * * * *